United States Patent
Yu et al.

(10) Patent No.: US 9,543,238 B1
(45) Date of Patent: Jan. 10, 2017

(54) SEMICONDUCTOR DEVICE

(71) Applicant: Fitipower Integrated Technology, Inc., Hsinchu (TW)

(72) Inventors: Shang-Cheng Yu, Hsinchu (TW); Chih-Nan Cheng, Hsinchu (TW)

(73) Assignee: Fitipower Integrated Technology, Inc., Hsinchu (TW)

( * ) Notice: Subject to any disclaimer, the term of this patent is extended or adjusted under 35 U.S.C. 154(b) by 0 days.

(21) Appl. No.: 14/808,766

(22) Filed: Jul. 24, 2015

(51) Int. Cl.
*H01L 23/495* (2006.01)

(52) U.S. Cl.
CPC ... *H01L 23/49541* (2013.01); *H01L 23/49503* (2013.01); *H01L 23/49537* (2013.01)

(58) Field of Classification Search
None
See application file for complete search history.

(56) References Cited

U.S. PATENT DOCUMENTS

| | | | | |
|---|---|---|---|---|
| 4,967,260 A | * | 10/1990 | Butt | H01L 22/32 257/668 |
| 5,521,431 A | * | 5/1996 | Tahara | H01L 23/495 257/666 |
| 5,946,198 A | * | 8/1999 | Hoppe | G06K 19/07749 257/531 |
| 6,891,462 B2 | * | 5/2005 | Andoh | H01F 17/0006 336/200 |
| 7,755,199 B2 | * | 7/2010 | Wu | H01L 23/49544 257/773 |
| 2013/0329335 A1 | * | 12/2013 | Obata | G06F 3/046 361/278 |
| 2014/0340857 A1 | * | 11/2014 | Hsu | H05K 1/0283 361/749 |

\* cited by examiner

*Primary Examiner* — Michael Lebentritt
(74) *Attorney, Agent, or Firm* — Zhigang Ma

(57) ABSTRACT

A semiconductor device includes a center semiconductor chip with a plurality of die pads, a plurality of lead frames, and a plurality of connecting components. The lead frame encapsulates the center semiconductor chip. Each connecting components establishes an electrical connection between the center semiconductor chip and the lead frame. At least one of the center semiconductor chip, the lead frame, and the connecting component forms an indicator.

16 Claims, 5 Drawing Sheets

SEMICONDUCTOR DEVICE

CROSS-REFERENCE TO RELATED APPLICATIONS

Field

The subject matter herein generally relates to a semiconductor device.

BACKGROUND

A semiconductor device for adjusting an output voltage, such as buck integrated circuit (IC) or boost IC, includes a center semiconductor chip, a plurality of lead fingers, and a lead frame. The center semiconductor chip includes a plurality of die pads. The lead frame is used for establishing an electrical connection between the die pads and the lead fingers. The lead fingers connected with an external inductor outputs an adjusted voltage. Some of the lead fingers are electrically connected with each other via external electrical components, such as an external inductor, external capacitors, and external resistances.

BRIEF DESCRIPTION OF THE FIGURES

Implementations of the present technology will now be described, by way of example only, with reference to the attached figures.

DETAILED DESCRIPTION

Figure 1:
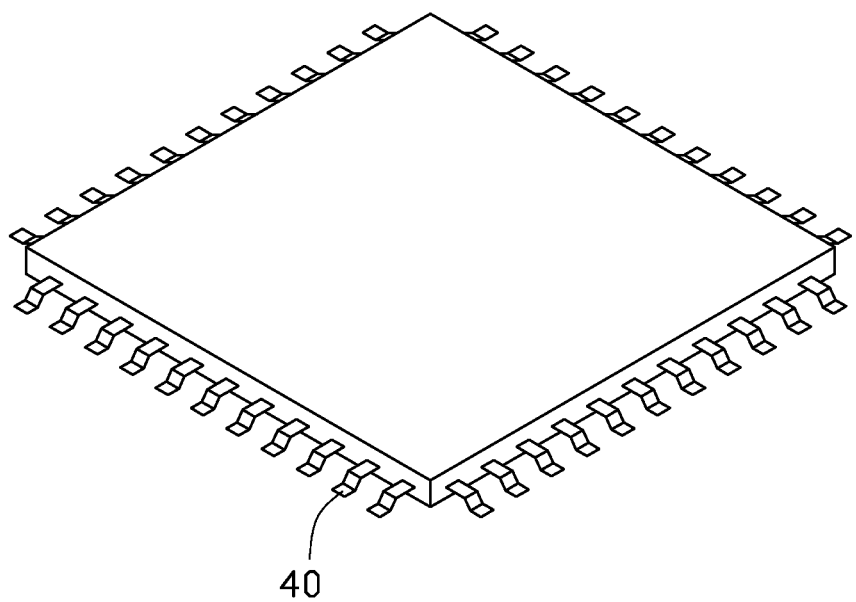
FIG. 1 is an isometric view of an embodiment of a semiconductor device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
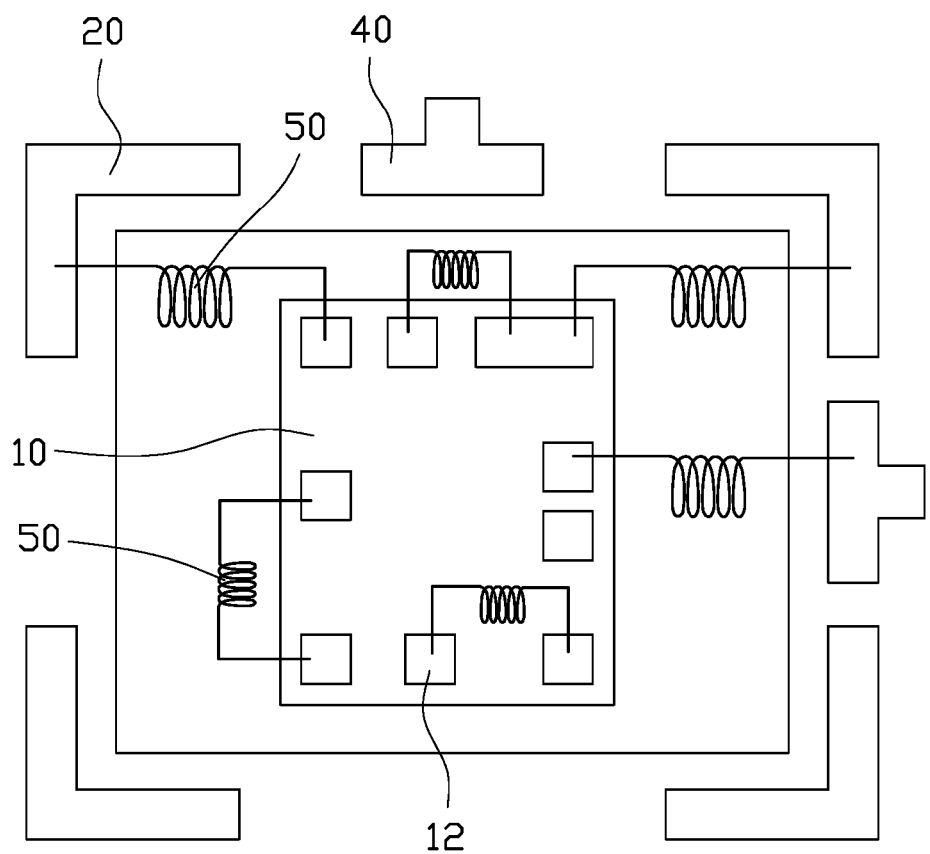
FIG. 2 is a cross-sectional view of an embodiment of the semiconductor device of FIG. 1, the semiconductor device comprising a plurality of lead fingers and connecting components.

FIGS. 1-2 illustrate a semiconductor device 100 of the embodiment. The semiconductor device 100 includes a center semiconductor chip 10, a plurality of lead frames 20, and a plurality of connecting components 50.

Figure 4:
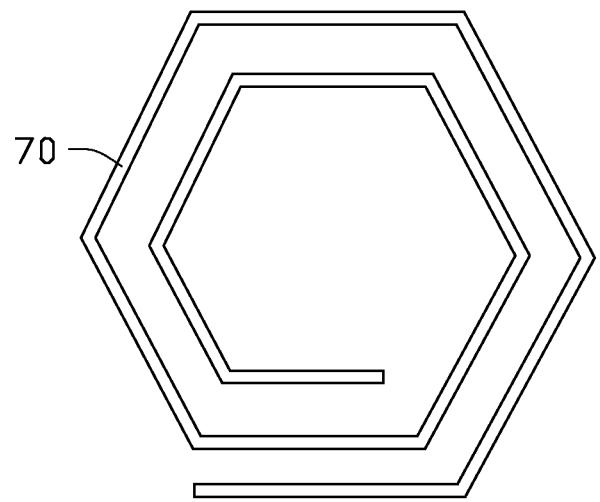
FIG. 4 is a diagrammatic view of a second embodiment of the lead finger of FIG. 3.

The semiconductor chip 10 is substantially a rectangular shaped. The center semiconductor chip 10 includes a plurality of die pads 12 mounted on a surface of the center semiconductor chip 10. The semiconductor chip 10 is capable of forming an inside coiled inductor with a series of concentric squares (as shown in FIG. 4). In at least one embodiment, the semiconductor chip 10 is a buck integrated circuit (IC). In other embodiments, the semiconductor chip 10 is a boost IC.

The lead frames 20 separated from each other cooperate with each other to form a space (not labeled) to encapsulate the center semiconductor chip 10. Some of the frames 20 are bent to form lead fingers 40.

Figure 3:
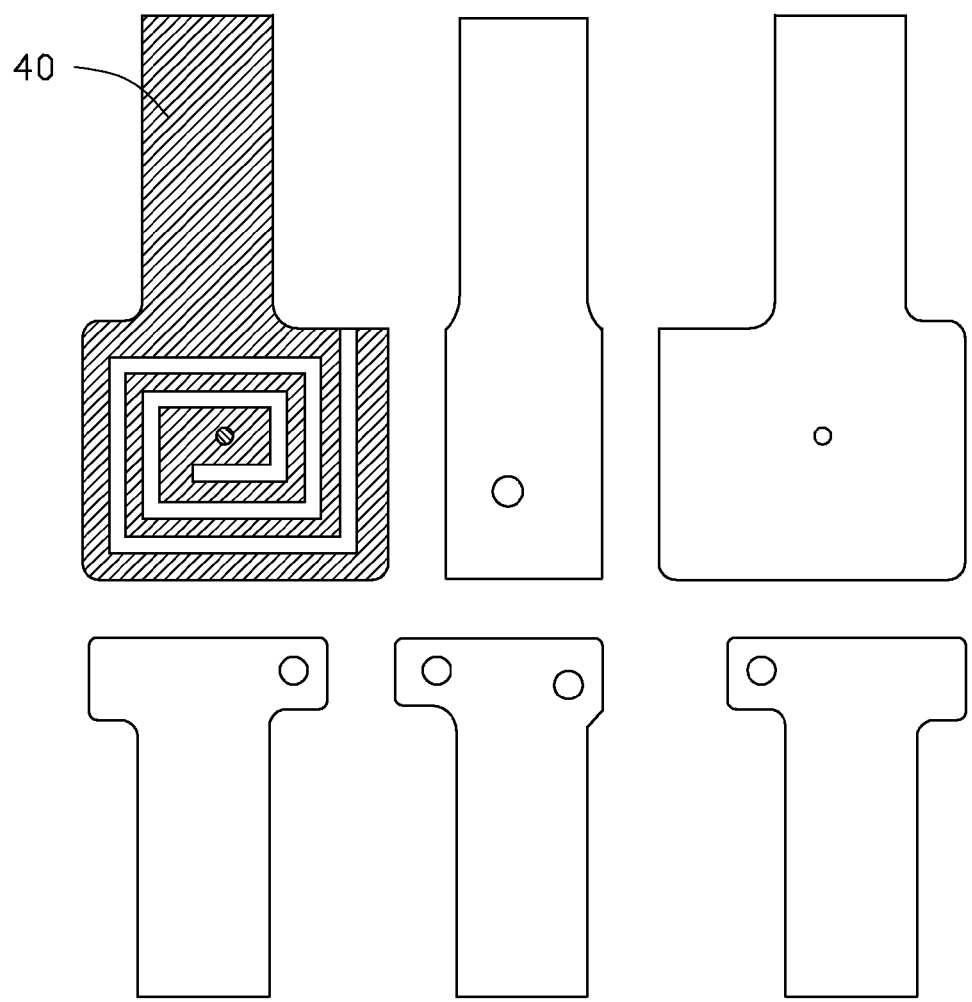
FIG. 3 is a diagrammatic view of a first embodiment of the lead finger of FIG. 2.

FIG. 3 illustrates a first embodiment of the lead finger 40. The lead fingers 40 are capable of connecting with an external circuit board. Each lead fingers 40 partially exposed from the semiconductor device 100 establishes an electrical connection with the external circuit board. The lead finger 40 located inside the semiconductor device 100 is capable of forming a coiled pattern acted as an inductor via an etching manner or a laser. The lead finger 40 is substantially a polygonal prism shaped. The lead finger 40 is capable of coiling to form an inductor in the semiconductor device 100. A shape of the lead finger 40 forms a series of concentric squares. In other embodiments, a shape of the inductor formed by the center semiconductor chip 10 or the connecting component 50 is equal to the shape of the lead finger 40.

The connecting component 50 connects between the die pad 12 and the lead frame 20, or connect between two die pad 12. In at least one embodiment, the connecting component 50 is a bonding wire. In other embodiments, the connecting component 50 can be a cooper pillar bump.

Based on the structure of the semiconductor device 100, any of the center semiconductor chip 10, the lead finger 40, or the connecting component 50 can form an internal inductor. Therefore, the semiconductor device 100 directly outputs a voltage without external electrical components, and an availability of the lead fingers 40 is improved.

FIG. 4 illustrates a second embodiment of the lead finger 70. The lead finger 70 is substantially a polygonal prism shaped. The lead finger 70 is coiled and forms an inductor in the semiconductor device 100. A shape of the lead finger 70 is formed by a series of concentric hexagons. In other embodiments, a shape of the inductor formed by the center semiconductor chip 10 or the connecting component 50 is equal to the shape of the lead finger 70.

Figure 5:
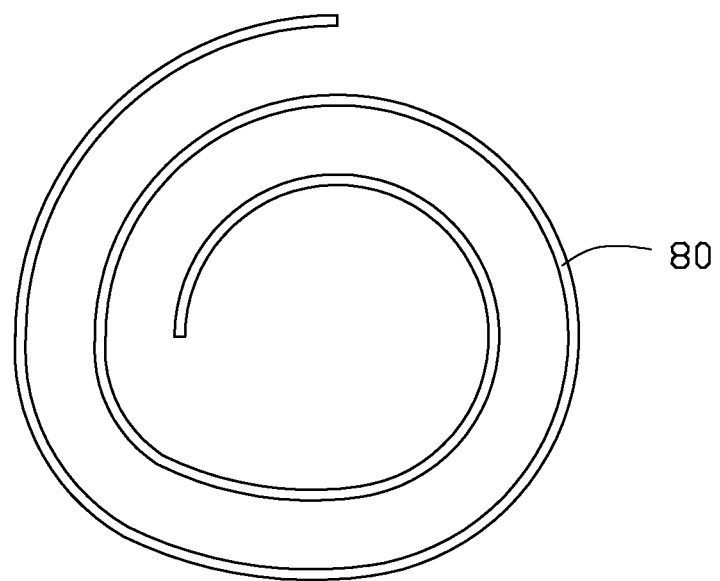
FIG. 5 is a diagrammatic view of a third embodiment of the lead finger of FIG. 3.

Based on the structure of the semiconductor device 100, any of the center semiconductor chip 10, the lead finger 70, or the connecting component 50 can form an internal inductor. Therefore, the semiconductor device 100 directly outputs a voltage without external electrical components, and an availability of the lead fingers 40 is improved FIG. 5 illustrates a third embodiment of the lead finger 80. The lead finger 80 is substantially a polygonal prism shaped. The lead finger 80 is coiled and forms an inductor in the semiconductor device 100. A shape of the lead finger 80 is formed by a series of concentric circles. In other embodiments, a shape of the inductor formed by the center semiconductor chip 10 or the connecting component 50 is equal to the shape of the lead finger 80.

Figure 6:
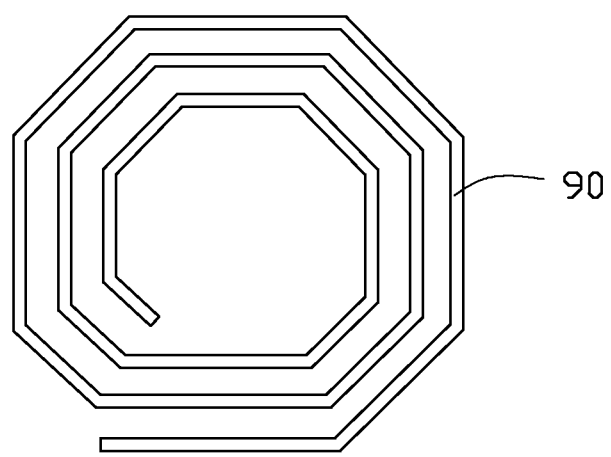
FIG. 6 is a diagrammatic view of a fourth embodiment of the lead finger of FIG. 3.

Based on the structure of the semiconductor device 100, any of the center semiconductor chip 10, the lead finger 80, or the connecting component 50 can form an internal inductor. Therefore, the semiconductor device 100 directly outputs a voltage without external electrical components, and an availability of the lead fingers 40 is improved FIG. 6 illustrates a fourth embodiment of the lead finger 90. The lead finger 90 is substantially a polygonal prism shaped. The lead finger 90 is coiled and forms an inductor in the semiconductor device 100. A shape of the lead finger 90 is formed by a series of concentric octagons. In other embodiments, a shape of the inductor formed by the center semiconductor chip 10 or the connecting component 50 is equal to the shape of the lead finger 90.

Based on the structure of the semiconductor device 100, any of the center semiconductor chip, the lead finger, or the connecting component can form an internal inductor. Therefore, the semiconductor device 100 directly outputs a voltage without external electrical components, and an availability of the lead fingers is improved.

While various exemplary and preferred embodiments have been described, the disclosure is not limited thereto. On the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A semiconductor device comprising:
   a center semiconductor chip with a plurality of die pads;
   a plurality of lead frames configured to form a space to encapsulate the center semiconductor chip;
   a plurality of connecting components coupled to the center semiconductor chip, each of the connecting components configured to establish an electrical connection between the center semiconductor chip and the lead frame; and
   wherein an inductor is formed by at least one of the center semiconductor chip, the lead frames, and the connecting component being patterned.

2. The semiconductor device of claim 1, wherein the inductor is in the center semiconductor chip.

3. The semiconductor device of claim 1, wherein at least one of the lead frames comprises a bent lead finger partially exposed from the semiconductor device, a portion of each lead finger located inside the semiconductor device comprises a coiled pattern acting as an inductor; each of the lead fingers establishes an electrical connection with an external circuit board beside the semiconductor device.

4. The semiconductor device of claim 1, wherein the inductor is the connecting component.

5. The semiconductor device of claim 1, wherein a shape of the inductor is a series of concentric squares.

6. The semiconductor device of claim 1, wherein a shape of the inductor is a series of concentric hexagons.

7. The semiconductor device of claim 1, wherein a shape of the inductor is a series of concentric circles.

8. The semiconductor device of claim 1, wherein a shape of the inductor is a series of concentric octagons.

9. A semiconductor device comprising:
   a center semiconductor chip with a plurality of die pads;
   a plurality of lead frames configured to form a space to encapsulate the center semiconductor chip; and
   a plurality of connecting components, each of the connecting component configured to establish an electrical connection between the center semiconductor chip and the lead frame;
   wherein at least one inductor is encapsulated inside the semiconductor device.

10. The semiconductor device of claim 9, wherein the inductor is in the center semiconductor chip.

11. The semiconductor device of claim 9, wherein at least one of the lead frames are bent to form lead fingers partially exposed from the semiconductor device, a portion of each lead finger located inside the semiconductor device deforms to form a coiled pattern acted as an inductor; each of the lead fingers establishes an electrical connection with an external circuit board beside the semiconductor device.

12. The semiconductor device of claim 9, wherein the inductor is the connecting component.

13. The semiconductor device of claim 9, wherein a shape of the inductor is a series of concentric squares.

14. The semiconductor device of claim 9, wherein a shape of the inductor is a series of concentric hexagons.

15. The semiconductor device of claim 9, wherein a shape of the inductor is a series of concentric circles.

16. The semiconductor device of claim 9, wherein a shape of the inductor is a series of concentric octagons.

* * * * *